United States Patent [19]
Bode et al.

[11] Patent Number: 5,457,699
[45] Date of Patent: Oct. 10, 1995

[54] ELECTRONIC COMPONENT WITH A SHIFT REGISTER TEST ARCHITECTURE (BOUNDARY SCAN)

[75] Inventors: Hans-Joergen Bode, München; Klaus Lueders, Markt Schwaben, both of Germany

[73] Assignee: Siemens Aktiengesellschaft, Munich, Germany

[21] Appl. No.: 127,231

[22] Filed: Sep. 27, 1993

[30] Foreign Application Priority Data

Sep. 25, 1992 [DE] Germany .......................... 42 32 271.5

[51] Int. Cl.⁶ ................................................ H04B 17/00
[52] U.S. Cl. ......................................... 371/22.3; 324/73.1
[58] Field of Search ................................. 371/22.3, 21.6; 324/158 R, 73.1; 307/465, 272.2

[56] References Cited

U.S. PATENT DOCUMENTS

| | | | |
|---|---|---|---|
| 5,015,875 | 5/1991 | Giles et al. ............................. | 327/203 |
| 5,150,044 | 9/1992 | Hashizume et al. ................. | 324/158 R |
| 5,155,732 | 10/1992 | Jarwala ................................. | 371/22.3 |
| 5,221,865 | 6/1993 | Phillips et al. ........................... | 307/465 |
| 5,222,068 | 6/1993 | Burchard ................................. | 371/22.3 |
| 5,254,942 | 10/1993 | D'Souza et al. ...................... | 324/158 R |
| 5,281,864 | 1/1994 | Hahn et al. ........................... | 307/272.2 |
| 5,311,520 | 5/1994 | Raghavachari .......................... | 371/21.6 |

FOREIGN PATENT DOCUMENTS 0430844  6/1991  European Pat. Off. .

OTHER PUBLICATIONS

Publication: Elektronik Sep. 1928, .4. 1989, Maierhofer et al, "JTAG Boundary–Scan", pp. 108–113.
Research Disclosure, No. 308, Dec. 1989, New York, p. 954.
"Der JTAG Boundary-Scan", Elektronik, vol. 38, No. 9, Apr. 1989, München, pp. 108–113.
IBM Technical Disclosure Bulletin, vol. 22, No. 12, May 1980, p. 5411.

*Primary Examiner*—Emanuel T. Voeltz
*Assistant Examiner*—Craig Steven Miller
*Attorney, Agent, or Firm*—Herbert L. Lerner; Laurence A. Greenberg

[57] ABSTRACT

An electronic component with a shift register test architecture (boundary scan) includes test cells. A register cell in a test cell is programmable with a manufacturer datum.

4 Claims, 2 Drawing Sheets

ELECTRONIC COMPONENT WITH A SHIFT REGISTER TEST ARCHITECTURE (BOUNDARY SCAN)

BACKGROUND OF THE INVENTION

1. Field of the Invention

The invention relates to an electronic component with a shift register test architecture (boundary scan).

Given the high degree of complexity of integrated circuit systems and the miniaturization achieved in the field of connection and construction techniques for electronic component groups, conventional testing methods more and more often appear achievable only at disproportionate expense. A test method that uses a test device integrated into the electronic component, which is known as a boundary scan and is standardized under IEEE Standard 1149.1, is therefore gaining increasing significance.

An essential characteristic of that test device is a shift register inserted between component terminals and circuit terminals of the component core. The shift register makes it possible to serially adjust and observe all of the component connections. Through the use of an interface, the shift register on the component can be controlled, and the shift registers of a plurality of components in one component group can be connected to make a ring structure, for instance. Test data can be shifted in and out on a component group, and when they are evaluated they enable error location that pertains both to the individual components and to their connecting lines.

The boundary scan test device of a component, which meets IEEE Standard 1149.1, can be adjusted to various operating modes through component terminals that are specific for particular testing techniques. That is described, for instance, in the publication by J. Maierhofer and B. Müller, entitled: The "JTAG Boundary-Scan" in Elektronik No 9/1989, pp. 108–113.

The above-mentioned publication explains that the boundary scan test device can optionally include a manufacturer register. This manufacturer register is 32 bits wide and contains information about manufacturer data as well as an identification code and a version number. Typically, the manufacturer register is constructed as an additional register. Since the manufacturer register is optional, and since silicon surface area is very expensive, only relatively large electronic components, in which the additional space required for the manufacturer register is not a major factor, generally include this option.

SUMMARY OF THE INVENTION

It is accordingly an object of the invention to provide an electronic component with a shift register test architecture (boundary scan), which overcomes the hereinafore-mentioned disadvantages of the heretofore-known devices of this general type and which provides a possibility for achieving a manufacturer register without requiring additional space on a component core, or in other words in a useful circuit.

With the foregoing and other objects in view there is provided, in accordance with the invention, an electronic component with a shift register test architecture (boundary scan), comprising test cells; and a register cell in one of the test cells being programmable with a manufacturer datum.

In accordance with another feature of the invention, there is provided a multiplexer for writing the manufacturer datum into the register cell, the multiplexer having other data inputs being connected to an adjacent one of the test cells and to an internal or external component terminal.

In accordance with a further feature of the invention, one test cell has a shift path in which the register cell is disposed.

In accordance with a concomitant feature of the invention, there is provided a synchronously controllable memory cell in series with the register cell.

Other features which are considered as characteristic for the invention are set forth in the appended claims.

Although the invention is illustrated and described herein as embodied in an electronic component with a shift register test architecture (boundary scan), it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
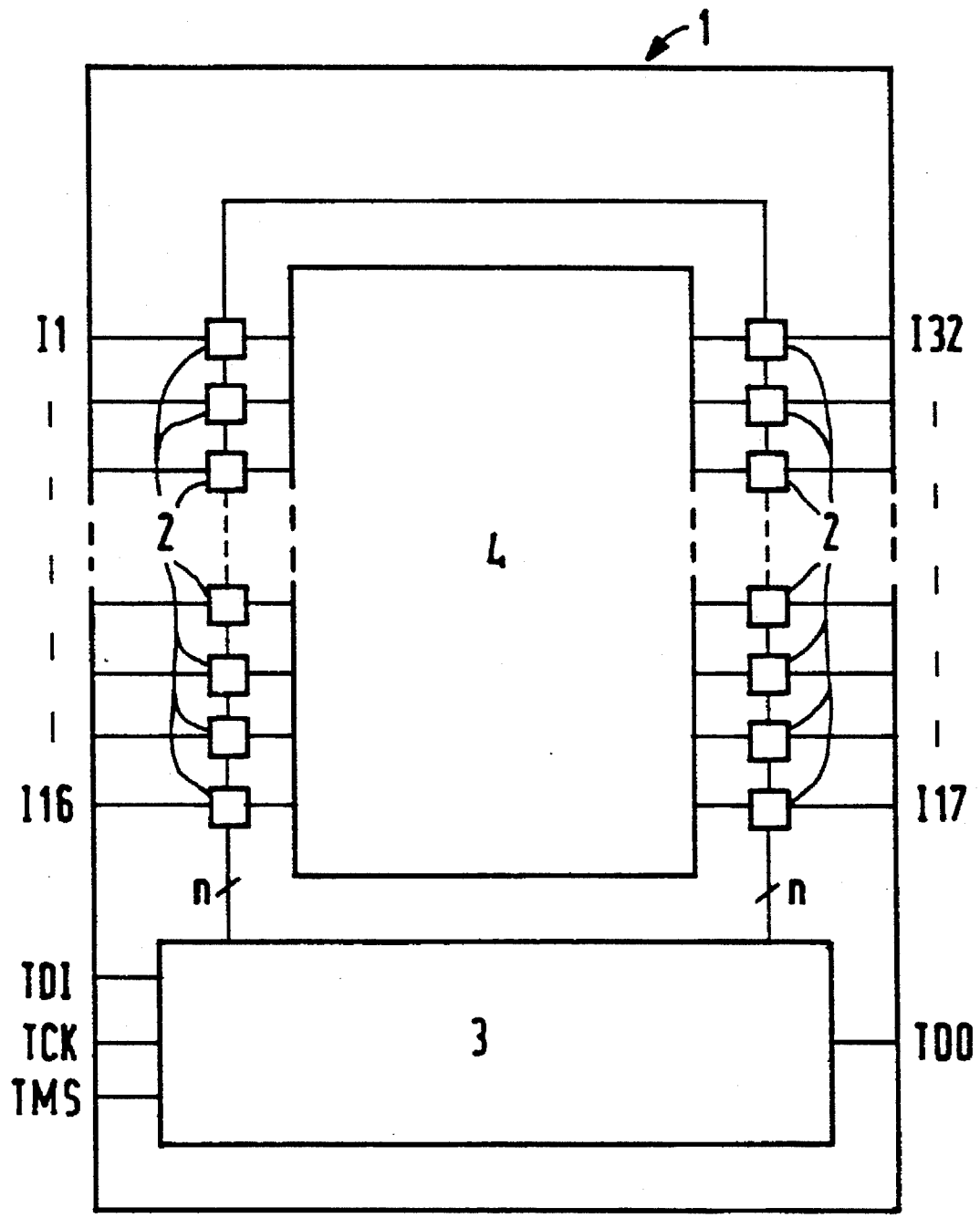
FIG. 1 is a diagrammatic view of an electronic component with a boundary scan test device according to the invention.

Referring now to the figures of the drawing in detail and first, particularly, to FIG. 1 thereof, there is seen an electronic component 1 with a shift register test architecture (boundary scan) that includes a component core 4 with a useful circuit, as well as a boundary scan test device. This test device includes test cells 2 and a flow control 3. The test cells are connected on the component between component connections I1–I32 and the component core 4. The test cells are connected to one another through data lines n and are connected to the flow control 3.

In accordance with IEEE Standard 1149.1, four additional terminals are provided, both on the component plane and on a component group plane having a plurality of such components. Test patterns are written into the boundary scan through a data input TDI and can be read out serially through an output TDO. A central test clock TCK enables a derivation of clock phases for synchronizing the test flow. A test mode can be selected through an input TMS by writing in serial protocol data for controlling the flow of the test. A supply voltage with potentials VDD and VSS for the electronic component is applied through two of the terminals I1–I32.

The invention provides for each of the test cells (boundary scan cells) which are known, for instance, from the publication mentioned above, to include one register cell, which can be programmed with some manufacturer datum. In the same way as known test cells receive test data or data from the component core or from terminals of the component with the aid of a multiplexer, the register cell can be programmed with manufacturer data. The programming is performed in such a way that a potential value that is present in any case on the component for the supply voltage, that is VDD or VSS, is applied in a specific operating mode to the register cell. This is quasi-equivalent to resetting the cell. Since the test cells are programmable, the manufacturer register can accordingly be implemented into the boundary scan, or in other words the test cells that are necessary anyway. No additional space is needed to achieve the manufacturer register on the component core.

Figure 2:
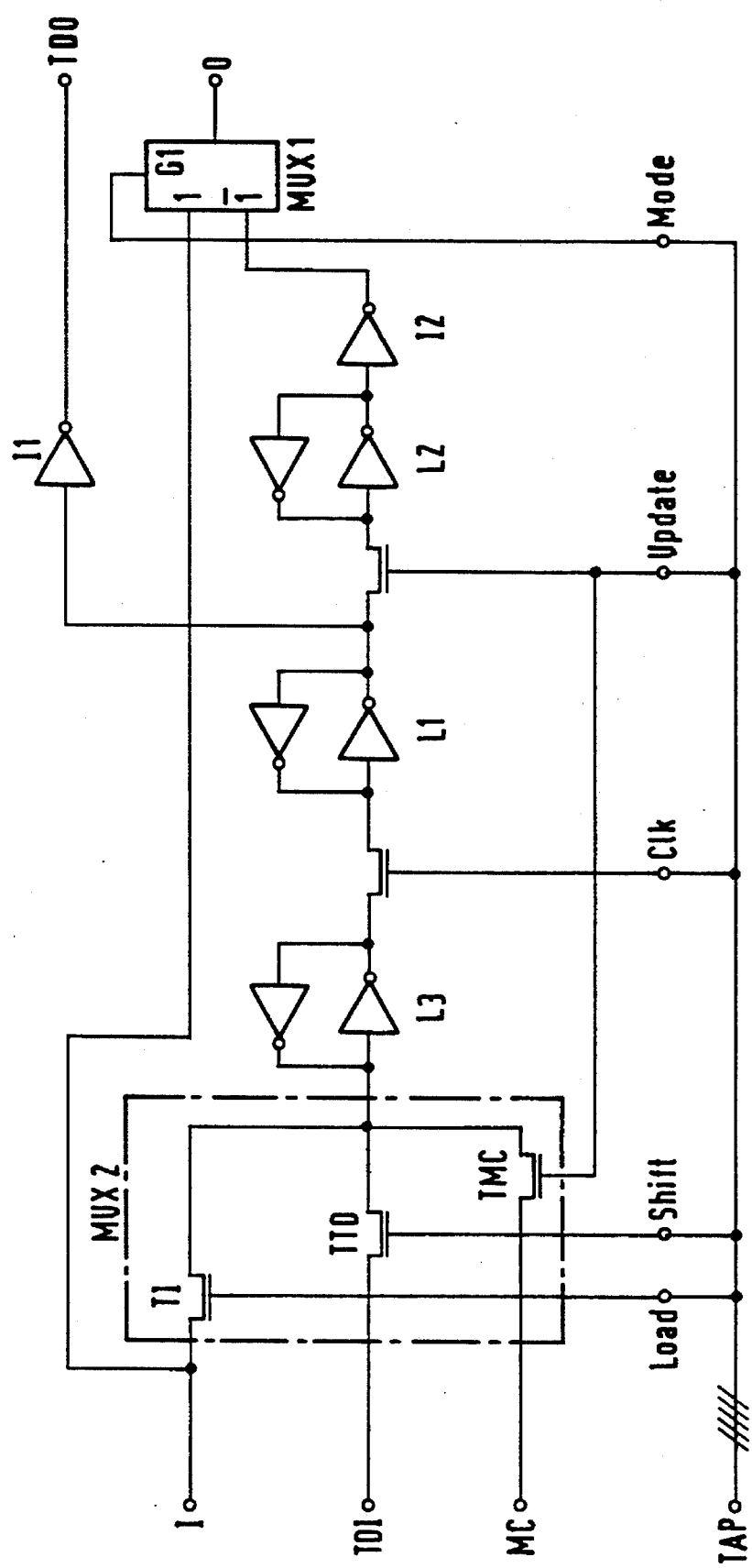
FIG. 2 is a basic schematic circuit diagram of a test cell according to the invention.

FIG. 2 shows a schematic circuit diagram for making a test call according to the invention. The test cell can be universally used for an input cell or an output cell of an integrated circuit. In the case of a tri-state-capable output cell, two test cells are needed. With a first multiplexer MUX1 located in a signal path between terminals I and O, in a normal mode the input signals, and in a test mode the test data of the boundary scan, can be switched through.

The terminals I and O then form terminals of the electronic component, or of the component core. In the normal mode, only the multiplexer MUX1 acts upon the signal path. In the test mode, which is established with the aid of a mode terminal from a bus TAP of the flow control, data stored in a memory cell L2 are switched through to the output O through an inverter I2. The memory cell L2 is constructed as a latch including two inverters being connected counter to one another. Through the use of a second multiplexer MUX2, signals from the component core or from the component terminal I, test data through the terminal TDI, or a manufacturer code through the terminal MC, can be written into a memory cell L3. The multiplexer is controlled with signals that are furnished by the flow control through the bus terminal TAP. Therefore, a load terminal acts through a transistor TI to switch through the terminal I to the test cell L3. A shift signal applied to a transistor TTD switches through the test data at the terminal TDI to the memory cell L3. An update control signal applied to a transistor TMC switches through a terminal MC with a programmed manufacturer code to the memory cell L3. Provision is naturally made in the flow control to prevent the control signals from the transistors TI, TTD and TMC from overlapping.

With the aid of a clock signal CLK from the bus TAP of the flow control, the value stored by the memory cell L3 is synchronously taken over into the memory cell L1. The multiplexer MUX2 and the memory cells L1 and L3 form a shift path of the boundary scan. Correspondingly, an output terminal of the memory cell L1 is applied through an inverter I1 to the test data output TDO. The output of the memory cell L1 travels through a transistor that is controlled by the update terminal and is not provided with its own reference numeral, is taken over into the memory cell L2, and is applied through an inverter I2 to a data terminal of the multiplexer MUX1. At the same time, the manufacturer code is taken over into the test cell or test cells, which is comparable to resetting of the cells.

The manufacturer code, that is a reset value of VDD or VSS, is applied at the terminal MC. The control signal at the update terminal of the flow control bus TAP that enables the resetting of the register cells then assures that this manufacturer code will be written into the register cell or the memory cell L3. Since each test cell of the boundary scan is equipped with such a register cell, a manufacturer register with at least the bit width of the test cells can be implemented in this way, and its data can be read out serially. Since the boundary scan test cells already take up space in the terminal region of the component, the implementation of the manufacturer register provided according to the invention presents no further difficulty in this respect. No additional space is needed for the component core of the electronic component.

We claim:

1. An electronic circuit component with a component core and a shift register test architecture, comprising:

a plurality of test cells, each of said test cells being formed of a plurality of register cells mutually connected in series and controllable with control signals;

switch means connected to said register cells for selectively inputting into said register cells data from a core of the electronic circuit component or from a respectively adjacent test cell;

a further register cell connected between said switch means and said plurality of register cells;

a further switch connected to said further register cell;

said further switch being switchable with one of the control signals, and said further register cell selectively receiving data from the component core or from a mutually adjacent register cell, or the manufacturer datum; and said further switch determining a binary state of the manufacturer datum by connecting with a given supply voltage of the electronic circuit component.

2. The component according to claim 1, including a multiplexer containing said switch means and said further switch for writing the manufacturer datum into said further register cell, said multiplexer having other data inputs being connected to an adjacent one of said test cells and to an internal or external component terminal.

3. The component according to claim 1, wherein one of said test cells has a shift path in which said further register cell is disposed.

4. The component according to claim 1, including a synchronously controllable memory cell in series with further said register cell.

* * * * *